(12) United States Patent
Benwadih

(10) Patent No.: US 7,964,901 B2
(45) Date of Patent: Jun. 21, 2011

(54) TRANSISTOR WITH WIRE SOURCE AND DRAIN

(75) Inventor: Mohamed Benwadih, Grenoble (FR)

(73) Assignee: Commissariat à l'Energie Atomique, Paris (FR)

( * ) Notice: Subject to any disclaimer, the term of this patent is extended or adjusted under 35 U.S.C. 154(b) by 0 days.

(21) Appl. No.: 12/625,909

(22) Filed: Nov. 25, 2009

(65) Prior Publication Data

US 2010/0176425 A1 Jul. 15, 2010

(30) Foreign Application Priority Data

Jan. 15, 2009 (FR) ...................................... 09 50198

(51) Int. Cl.
*H01L 29/06* (2006.01)
(52) U.S. Cl. ... 257/288; 257/40; 257/618; 257/E29.255; 174/88 R
(58) Field of Classification Search .................... 257/40, 257/288, 618, E51.006, E29.255; 174/88 R, 174/129 R, 133 R, 128.1; 385/123
See application file for complete search history.

(56) References Cited

U.S. PATENT DOCUMENTS

| | | | | |
|---|---|---|---|---|
| 4,468,089 A * | 8/1984 | Brorein | | 385/114 |
| 6,437,422 B1 * | 8/2002 | Solomon et al. | | 257/618 |
| 7,205,478 B2 * | 4/2007 | Kline | | 174/88 R |
| 7,491,613 B2 * | 2/2009 | Kasama et al. | | 438/290 |
| 2005/0218461 A1 * | 10/2005 | Kasama et al. | | 257/401 |
| 2005/0227059 A1 * | 10/2005 | Granstrom et al. | | 428/292.1 |
| 2005/0253134 A1 | 11/2005 | Kasama et al. | | |
| 2006/0208324 A1 * | 9/2006 | Kasama et al. | | 257/401 |
| 2006/0250075 A1 * | 11/2006 | Kasama et al. | | 313/504 |
| 2007/0278527 A1 * | 12/2007 | Kasama et al. | | 257/206 |

FOREIGN PATENT DOCUMENTS

WO  WO-2007064334 A1  6/2007

OTHER PUBLICATIONS

Francis Garnier, et al., Vertical Device Architecture By Molding of Organic-Based Thin Film Transistor, Applied Physics Letters, vol. 73, No. 12, Sep. 21, 1998, pp. 1721-1723.
Republique Francaise, Rapport De Recherche Preliminaire, dated Jul. 6, 2009, 2 pgs. In French language.

* cited by examiner

*Primary Examiner* — Matthew W Such

(57) ABSTRACT

Field-effect transistor that includes at least a gate, a layer of insulator, a drain, a source, a semi-conductor material connecting the source to the drain, the gate and the layer of insulator each surrounding the assembly constituted by the source, the drain and the semi-conductor material, the layer of insulator being arranged between the gate and said assembly. The drain and the source are constituted by first and second electrical conductors respectively, arranged in a parallel way and disconnected one from the other, the first and second conductors being surrounded by a layer of semi-conductor over their entire circumference and over at least a part of their length.

6 Claims, 2 Drawing Sheets

TRANSISTOR WITH WIRE SOURCE AND DRAIN

CROSS REFERENCE TO RELATED APPLICATIONS

This application claims priority under 35 U. S. C. §119 from French Patent Application No. 0950198 filed on Jan. 15, 2009 in the French Patent Office, the entire disclosure of which is incorporated herein by reference.

FIELD OF THE INVENTION

The invention relates to the field of field-effect transistors.

To be more precise, the invention relates to a field-effect transistor that includes at least a gate, an insulator, a drain, a source, a semi-conductor material separating the source from the drain, the gate and the insulator each surrounding the assembly constituted by the source, the drain and the semi-conductor material, the insulator being arranged between the gate and said assembly.

BACKGROUND OF THE INVENTION

Transistor design, particularly in the search for miniaturization, takes different criteria into account, particularly the required performance, and the technique of manufacture used.

The techniques for manufacturing the transistors shall preferably be accurate and inexpensive.

The performance of a field-effect planar transistor depends in particular on the geometry of the conduction channel connecting the drain and the source of the transistor. For example, the drain current, denoted $I_D$, depends in particular on the ratio of channel width W to channel length L (W/L). One solution for obtaining a better drain current $I_D$ comprises for example reducing the length L of the channel in order to increase the electric field E between the drain and the source, without needing to apply too large a potential $V_{DS}$ between the drain and the source ($E=V_{DS}/L$).

Furthermore, undesirable effects related to transistor geometry, such as edge effects, may appear and reduce transistor performance.

To meet these requirements, document U.S. 2005/0253134 proposes a "low gate" transistor with a cylindrical structure that gives a good W/L ratio and reduces the edge effects. To be more precise, according to one prior art alternative, the transistor is based on a fiber onto which is deposited a layer of semi-conductor, the fiber core being empty. The drain and source electrodes are implemented on the inner periphery of the layer of semi-conductor, symmetrically relative to the fiber axis. The assembly so constituted is surrounded by an insulating layer, and a layer forming the gate is then deposited over the entire outer periphery of said insulating layer.

Although the prior art solution is able to give a good W/L ratio by playing on the length of the transistor along the fiber, this solution demands complex and expensive manufacturing techniques.

In this context, the present invention proposes a field-effect transistor affording a different architecture from that proposed in the prior art, and that can be implemented with more straightforward and less expensive manufacturing techniques.

DISCLOSURE OF THE INVENTION

The object of the invention is a field-effect transistor that includes at least a gate, a layer of insulator, a drain, a source, a semi-conductor material connecting the source to the drain, the gate and the layer of insulator each surrounding an assembly constituted by the source, the drain and the semi-conductor material, the layer of insulator being arranged between the gate and said assembly.

According to the invention, the drain and the source are constituted by a first and a second electrical conductors respectively, arranged in a parallel way and disconnected one from the other, the first and second conductors being surrounded by a layer of the semi-conductor material over their entire circumference and over at least a part of their length.

In other words, two electrical conductors coated with semi-conductor constitute the drain and the source respectively of the transistor. The two conductors are arranged parallel to one another, spaced apart by the length of the conduction channel. The assembly is embedded in an insulator which is surrounded by a conductor constituting the gate.

In this configuration, the length of the transistor defined by the thickness of semi-conductor located between the two conductors is more constant and may be very slender.

To advantage, the length of the transistor is equal to the thickness of the layer of semi-conductor; the length is for example between 10 nanometers and 1 micrometer.

Preferably, the width of the transistor is equal to the length of the first or of the second conductor.

According to one embodiment, the first and second conductors are cylindrical in shape, and the gate may also be a cylindrical conductor.

The wire or cylindrical architecture has the advantage of offering a surface for the reception of larger charges, and therefore better electrical performance. In particular, all the charges in proximity to the drain will be collected, whereas in a planar structure, only the charges in the region between the surfaces opposite the source and the drain are collected.

Furthermore, on account of the fact that the source is parallel to the drain and that there is no projecting part in the drain and the source, edge effects are limited, and disturbances in the channel are reduced, thereby leading to continuity and electrical homogeneity in the channel.

Additionally, to obtain good control over the channel charges by means of a gate voltage $V_G$, the capacity $C_{ox}$ of the insulator must be as large as possible, the thickness $E_{ox}$ of the insulator must be as thin as possible and the dielectric constant $\epsilon_{ox}$ of the material constituting the insulator must be as large as possible. For example, the thickness of the insulator may be above 100 nanometers.

BRIEF DESCRIPTION OF THE DRAWINGS

Other characteristics and advantages of the invention will become clearer from the description set out hereinafter, for information purposes and in no way restrictively, with reference to the appended drawings, wherein.

DETAILED DISCLOSURE OF A PARTICULAR EMBODIMENT

Figure 1:
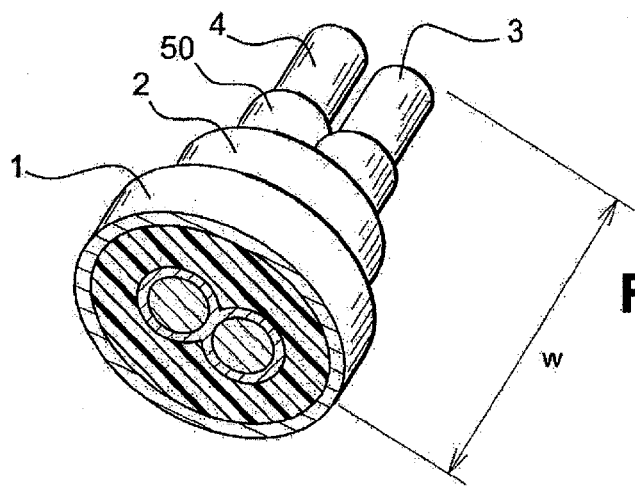
FIG. 1 is a perspective view of the different layers constituting the transistor according to one inventive embodiment.
Figure 2:
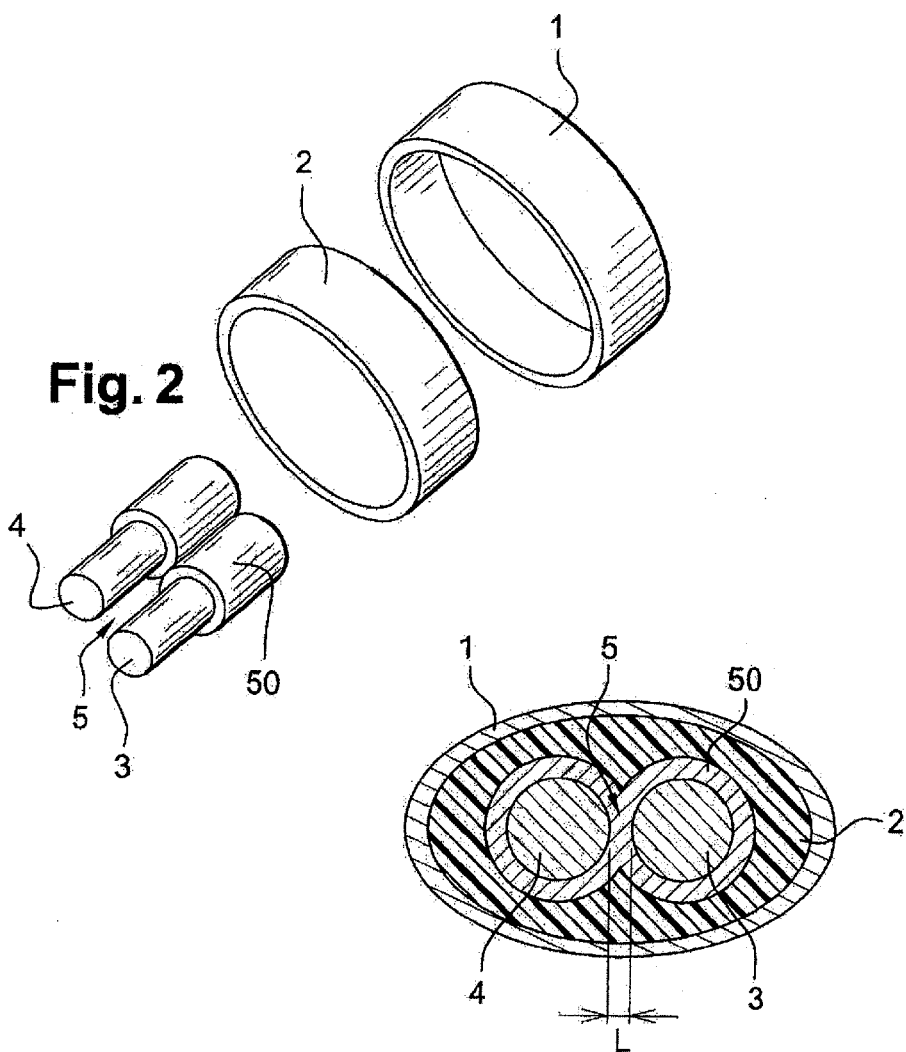
FIG. 2 is an exploded view of the transistor in FIG. 1.
Figure 3:
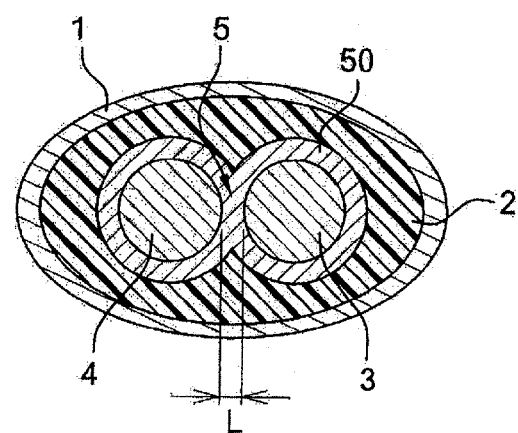
FIG. 3 is a transverse cross-section view of the transistor according to one inventive embodiment.

With reference to FIGS. 1 to 3, a field-effect transistor according to one inventive embodiment includes:

a first electrical conductor constituting the drain 3 of the transistor, and a second electrical conductor constituting the source 4 of the transistor.

The drain 3 and the source 4 may be constituted by wires based on metal or conductive material, for example silver wires 50 micrometers in diameter.

The transistor also includes a layer of semi-conductor 50 with a thickness to advantage of between 10 nanometers and 1 micrometer, surrounding the first and second conductors over their entire circumference and over at least part of their length, the first and second conductors being parallel and disconnected. The layer of semi-conductor is of the organic type, such as polycrystalline polymer, for example modified pentacene diluted in toluene.

The transistor further includes a layer of insulator 2 with a thickness of more than 100 nanometers, surrounding the assembly constituted by the source 4, the drain 3 and the layer of semi-conductor 50, and a metal layer constituting the gate 1 of the transistor, surrounding the layer of insulator 2. However, if the electric strength of the insulator is particularly high, its thickness may be less.

The layer of insulator may be made of an organic material, such as polyimide, polystyrene, fluoropolymer, PVP (polyvinylphenol), PMMA (polymethyl methacrylate), or the like, and the gate 1 may be a cylinder based on metal or conductive material.

Thus, according to this configuration, when the transistor is in operation, the conduction channel 5 of the transistor is created and is constituted by the layer of semi-conductor located between the first and second conductors, its length L being defined by the thickness of the layer of semi-conductor located between the two conductors, and its width W being mainly equal to the length of the first or of the second conductor. It is thus possible to obtain a good ratio W/L (large width W and short length L) by playing on the length of the electrical conductors and on the thickness of the layer of semi-conductor.

Account should further be taken of the circular shape of the drain: indeed, on account of this particular shape, the width of the channel is larger than W, since charges are collected over the entire periphery of the drain, and not only in the part opposite the source.

The wire or cylindrical architecture of the transistor so implemented has the advantage of offering a surface for the reception of larger charges, and therefore better electrical performance. Furthermore, since the drain and the source are parallel, the channel is electrically confined and is not disturbed by parasitic effects such as edge effects. Additionally, since the drain and the source have no projecting parts, such as an angle for example, the edge effects are further minimized The transistor proposed by the invention does not require the use of cumbersome and expensive microelectronics manufacturing techniques, such as the use of a clean room and lithography techniques. Indeed, the inventive transistor may be made at low cost by using for example manufacturing techniques from the textile world, since the organic materials used, such as polymers, can be deposited by means of printing techniques, for example contact or ink jet printing, or by means of spin-coating.

Figure 4:
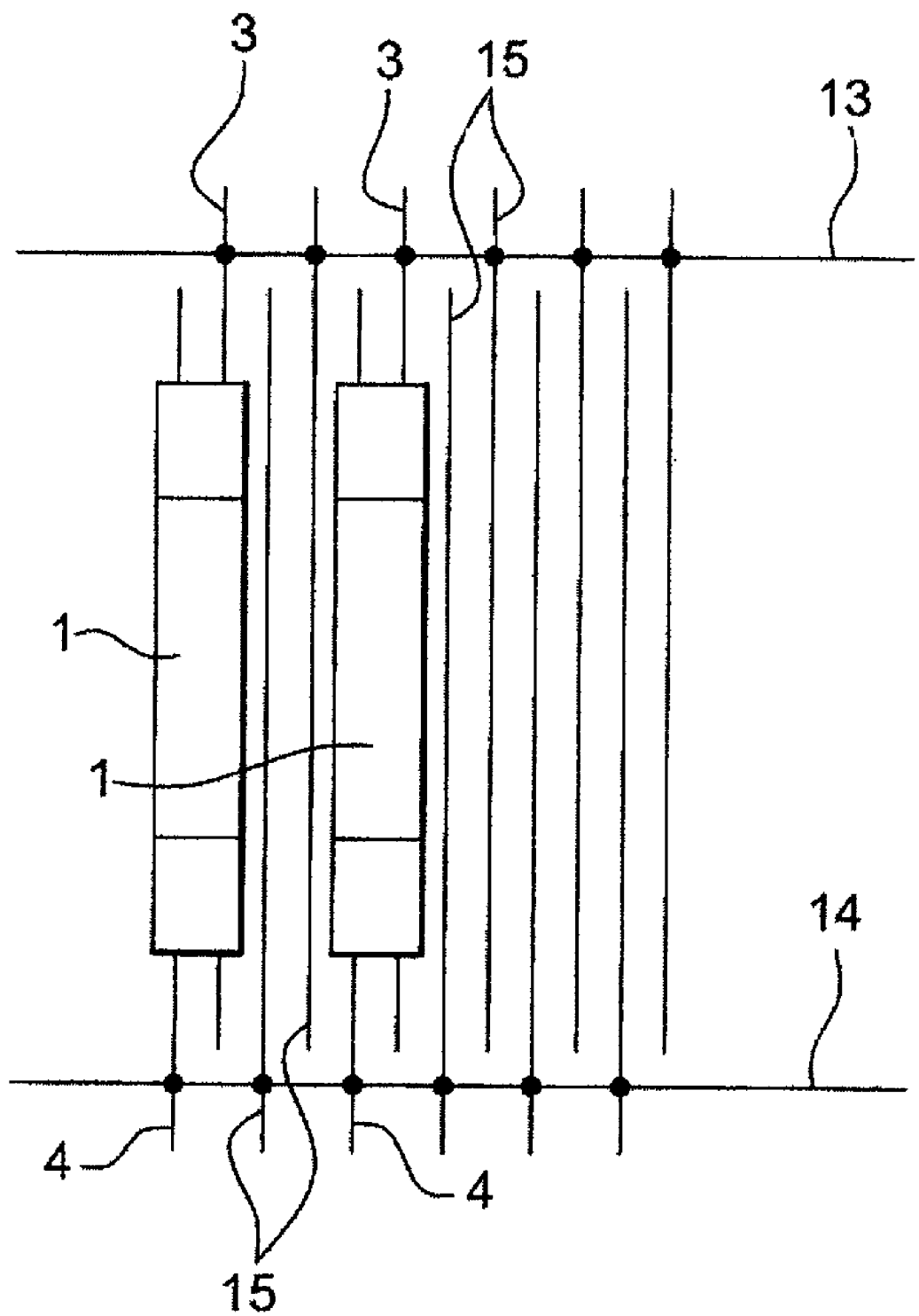
FIG. 4 is a diagrammatic representation of the integration of inventive transistors into a textile structure.

Moreover, its configuration facilitates its interconnection with other transistors of the same type. To this end, all that needs to be done is to elongate one of the conductors and connect them all together, as illustrated in the drawing in FIG. 4.

In this, the drain 3 wires are elongated on one side of the structure, and connected to one another by means of a single conductor wire 13. As a corollary, the source 4 wires are elongated on another side of the structure, and connected to each other by means of a single conductor wire 14. The reference number 15 has been used to denote the insulator wires, interspersed between two consecutive transistors. The integration of the inventive transistors within a textile structure can thus be seen, showing "passive" fibers and "active" fibers.

The inventive transistor may thus be used in very low cost applications, and in particular on large surface areas of short life-cycle flexible substrates, for example in the textile industry.

The invention claimed is:

1. A field-effect transistor comprising:
   a core assembly comprising
   (i) a drain constituted by a first electrical conductor,
   (ii) a source constituted of a second electrical conductor distinct from the first electrical conductor, and
   (iii) a layer of semi-conductor material coating an entire circumference of the first and second electrical conductors over at least a part of a length of the first and second electrical conductors and filling a gap between the first and second electrical conductors such that the layer of semi-conductor material contacts both the first and second electrical conductors;
   a layer of insulator coating the core assembly; and
   a layer of electrical conductor forming a gate and coating the layer of insulator,
   wherein the first and second electrical conductors are arranged in a parallel relation to one another.

2. The field-effect transistor as claimed in claim 1, wherein the field-effect transistor has a channel length (L) equal to a thickness of the layer of semi-conductor.

3. The field-effect transistor as claimed in claim 1, wherein the field-effect transistor has a channel length (L) of between 10 nanometers and 1 micrometer.

4. The field-effect transistor as claimed in claim 1, wherein the field-effect transistor has a channel width (W) equal to a length of the first or second electrical conductor.

5. The field-effect transistor as claimed in claim 1, wherein the first and second electrical conductors are cylindrical in shape.

6. The field-effect transistor as claimed in claim 1, wherein the layer of insulator has a thickness of more than 100 nanometers.

* * * * *